United States Patent [19]

Yuan et al.

[11] 4,380,020

[45] Apr. 12, 1983

[54] ACTIVE HIGH FREQUENCY SEMICONDUCTOR DEVICE WITH INTEGRAL WAVEGUIDE

[75] Inventors: Lloyd T. Yuan; Yu-Wen Chang, both of Rancho Palos Verdes; Thomas G. Mills, Carson, all of Calif.

[73] Assignee: TRW Inc., Redondo Beach, Calif.

[21] Appl. No.: 114,031

[22] Filed: Jan. 21, 1980

[51] Int. Cl.³ .......................................... H01L 27/26
[52] U.S. Cl. ........................................ 357/3; 331/96; 331/107 DP; 333/247; 333/250
[58] Field of Search .............. 357/3, 58; 333/236, 333/238, 247, 250; 331/96, 107 DP, 107 SL, 117 D

[56] References Cited

U.S. PATENT DOCUMENTS

| | | | |
|---|---|---|---|
| 3,903,488 | 9/1975 | Fong | 333/238 |
| 3,909,751 | 9/1975 | Tang et al. | 357/58 |
| 3,975,690 | 8/1976 | Flemming | 357/3 |
| 3,986,153 | 10/1976 | Kuno et al. | 333/236 |
| 4,301,429 | 11/1981 | Goldman et al. | 357/58 |

*Primary Examiner*—William D. Larkins
*Attorney, Agent, or Firm*—Robert W. Keller; Donald R. Nyhagen

[57] ABSTRACT

An active semiconductor device, such as a Gunn effect device, capable of operation at extremely high frequencies, fabricated in situ on a substrate that also serves as a dielectric waveguide to propagate energy from the device. In the embodiment disclosed, a Gunn effect diode is formed on a substrate of gallium arsenide (GaAs), together with a cavity region and a metalized heat sink layer permitting operation at relatively high power levels. A bias current is applied through a conductive strip and then through the cavity region to the diode, and a quarter-wave choke is provided in the conductive strip to prevent transmission of radio-frequency energy back along the strip.

14 Claims, 3 Drawing Figures

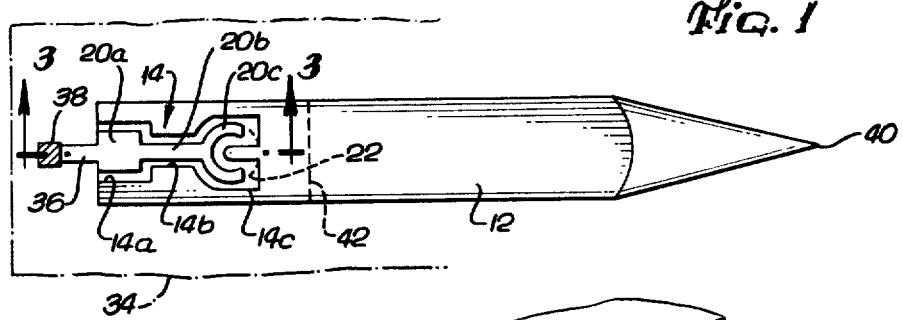
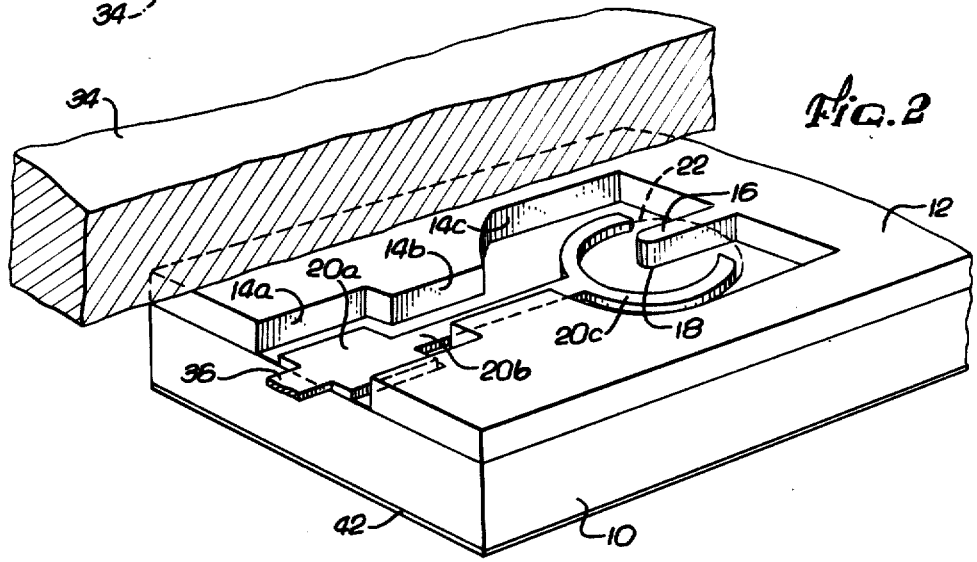
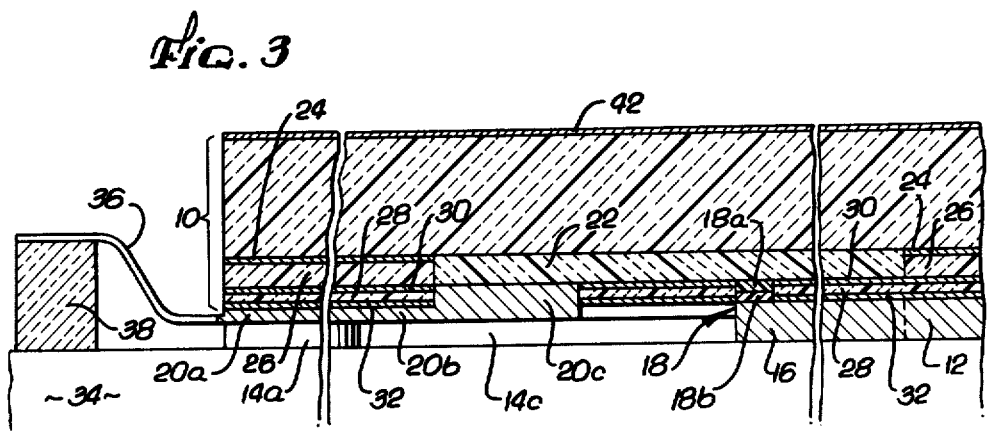

ACTIVE HIGH FREQUENCY SEMICONDUCTOR DEVICE WITH INTEGRAL WAVEGUIDE

BACKGROUND OF THE INVENTION

This invention relates generally to high-frequency active devices, such as Gunn effect oscillators and amplifiers, and, more particularly, to such devices operating in the microwave and millimeter-wave range.

The Gunn effect was first pointed out by J. B. Gunn in an article published in the IBM Journal of Research and Development, Vol. 8, No. 2, April, 1964, entitled "Instabilities of Current in III-V Semiconductors". Gunn noted that some semiconductors, such as Gallium Arsenide (Ga As), exhibit instabilities in their current-voltage characteristics above a voltage level known as the Gunn threshold. Subsequent work by Gunn and others has led to the development of a widely accepted theory of operation of Gunn effect devices, which are basically semiconductor diodes with cathode and anode terminals. The average carrier drift velocity in a Gunn diode first increases with increasing electric field, i.e., voltage, until the Gunn threshold is reached, after which the carrier drift velocity decreases, resulting in a negative differential conductivity above the threshold. A space charge builds up near the cathode of the device, and, above the threshold, is large enough to become a high electric field domain that reduces the electric field outside of the domain and also reduces the current through the device. Periodically, a domain breaks away from the cathode and drifts with the carrier stream to the anode of the device. Then the current increases again, until a new domain is formed, at which time the current abruptly falls. The time interval between current pulses thereby generated defines the fundamental frequency of oscillation of the device, which may be operated either as an oscillator or as an amplifier. A Gunn device is typically biased, by a direct current, to a point above the Gunn threshold, and it operating characteristics are determined in part by the impedance parameters of external circuit elements to which the device is connected.

Devices operating at extremely high frequencies, up to 300 gigahertz (GHz), require a waveguide structure to transmit the high-frequency energy away from the device. Typically, the waveguide structure has been fabricated separately from the semiconductor device itself, although it will be apparent that there are distinct advantages in combining a waveguide and high-frequency device, such as one of the Gunn type, in a single structure.

Prior to this invention, there have been a number of attempts to combine high-frequency semiconductor devices, such as Gunn devices, with various types of waveguides, and these will first be briefly discussed, to place the present invention in proper perspective. There are some devices that employ discrete Gunn-type components, as exemplified by those disclosed in U.S. Pat. No. 3,903,488 to Fong, and U.S. Pat. No. 3,986,153 to Kuno et al. The Fong patent relates to an improved form of a planar dielectric waveguide to which high-frequency devices such as Gunn diodes and IMPATT diodes (impact avalanche and transit time diodes) can be bonded. The Kuno patent similarly involves the use of discrete devices. So long as a Gunn type device or other active semiconductor device is in the discrete form, the well known advantages of monolithic fabrication are not realized, and the composite device will be relatively costly to produce and may not be totally reliable.

U.S. Pat. No. 3,975,690 to Fleming discloses a planar transmission line utilizing a semiconductor material of the type that exhibits the Gunn effect. The Fleming transmission line is both a Gunn type amplifier and a waveguide. Its use, however, is limited to relatively low-frequency applications, as determined by the width of a surface conductor strip on the device. Moreover, since heat is dissipated principally by conduction through a substrate on which the device is formed, its operation is limited to relatively low powers.

Another patent relating to the same general subject matter area is U.S. Pat. No. 3,866,142 to Jacobs et al, which discloses an integrated waveguide and passive high-frequency device, such as a PIN diode or mixer diode. Active devices, such as oscillators and amplifiers, are shown in the patent as being discrete from the waveguide structure.

It will be appreciated from the foregoing that there is still a need for an integrated structure that combines an active semiconductor device and a waveguide, capable of operation at extremely high frequencies and relatively high powers. The present invention fulfills this need.

SUMMARY OF THE INVENTION

The present invention resides in a monolithic, very-high-frequency active semiconductor device that includes an integral waveguide and is operable at relatively high power levels. Basically, and in general terms, the device of the invention comprises a semiconductor substrate that serves as a waveguide as well as a substrate, an active high-frequency semiconductor device formed integrally with the substrate, integral means for supplying bias power to the device, and integral heat sink means for removing power dissipated as heat in the device.

In a presently preferred form of the invention, the active device is a Gunn diode, and the means for supplying bias power includes a region in contact with the Gunn diode to provide electrical connection for the supply of bias power, and to function in addition as a cavity for operation of the device as an oscillator. The heat sink means is a metalized coating over substantially all of one surface of the device, to conduct heat therefrom and to provide a second electrical connection for the supply of bias power.

More specifically, the device of the invention comprises a number of layers of semiconductive and conductive material formed on one surface of the substrate, the layers including the cavity region, the Gunn diode itself next to the cavity region, and the metalized heat sink covering the Gunn diode and much of one surface of the devices. Bias power is supplied through a separate metalized supply strip which terminates in a part-circular element in contact with the cavity region, thereby supplying bias current through the cavity to the Gunn diode.

The bias current supply strip is disposed in a recess in the otherwise unbroken heat sink metalized layer, the recess and the supply strip being appropriately necked to provide a radio-frequency choke, the purpose of which is to preclude the propagation of any high-frequency components back into the dc bias power supply. Radio-frequency energy from the device is transmitted out from the cavity region into and along the substrate or waveguide, which may be metalized on its surface opposite that on which the Gunn diode is formed. The waveguide may be tapered to a point at its remote end, to provide for launching of the energy into another waveguide, or to serve as a transmitting antenna for the radio-frequency energy.

In the illustrative form of the invention, the waveguide material is semi-insulating gallium arsenide (GaAs) and the Gunn diode and cavity are formed as a layered structure of appropriately doped GaAs regions. Other layers surrounding the diode and its cavity use high resistivity polycrystalline GaAs and silicon dioxide ($SiO_2$).

It will be appreciated from the foregoing that the present invention represents a significant advance in the field of extremely-high-frequency semiconductor devices, such as Gunn devices. In particular, the invention provides a dielectric waveguide with an integrated or in situ Gunn device capable of operation at very extremely frequencies and relatively high powers. Other aspects and advantages of the invention will become apparent from the following more detailed description, taken in conjunction with the accompanying drawings.

BRIEF DESCRIPTION OF THE DRAWINGS

FIG. 1 is a bottom plan view of a Gunn-type oscillator embodying the present invention, including a baseplate drawn only in broken outline;

FIG. 2 is a fragmentary, enlarged, perspective view of the device shown in FIG. 1, taken from below the device; and FIG. 3 is a fragmentary sectional view taken substantially along the line 3—3 in FIG. 1.

DETAILED DESCRIPTION

As shown in the drawings for purposes of illustration, the present invention relates to high-frequency semiconductor devices, such as Gunn-type devices. More particularly, the invention is concerned with the integration of a Gunn-type device and a dielectric waveguide into a monolithic device capable of operation at very high frequencies, perhaps up to 300 gigahertz (GHz), and at relatively high powers. In accordance with the invention, a dielectric waveguide, having characteristic advantages of low loss, ease of manufacture, and compact and rugged construction, is combined with an in situ active device, such as a Gunn device, to provide all of the advantages usually associated with integrated circuits, such as low-cost, reliability and reproducibility.

Basically, as shown by way of example in FIG. 2, the device of the invention is formed on a substrate, indicated by reference numeral 10. As will be appreciated from the ensuing more detailed description, the substrate 10 includes a number of additional layers not shown in FIG. 2, and also forms the dielectric waveguide of the device. The substrate material is semiinsulating gallium arsenide (GaAs) having a resistivity approximately in the order of $10^7$ ohm-centimeter.

Deposited in one surface of the substrate 10 is a metalized layer 12 which is co-extensive with the substrate except for an irregularly shaped recess 14 formed by the omission of metalization. The layer 12 serves both as a heat sink to remove heat generated in the device, and as an electrical path for a bias current supplied to the device. The recess 14 may be described as approximately a key-hole shape, having a relatively wide first portion 14a with parallel sides extending perpendicularly from one edge of the layer 12, a reduced-width second portion 14b adjoining the first portion, also with parallel sides, and an enlarged-width third portion 14c adjoining the second portion. Extending into the enlarged-width portion 14c is an integral finger 16 of the metalized layer 12. The finger 16 is symmetrically located in the third portion 14c of the recess 14, and extends back toward the first and second portions of the recess. As will shortly be appreciated, the finger 16 makes thermal and electrical contact with one component layer of a Gunn diode, indicated at 18 in FIG. 2.

Disposed in the recess 14 is a conductive metal strip 20, used to supply bias current to the Gunn diode 18. The metal strip 20 comprises a relatively wide portion 20a, disposed in the first portion 14a of the recess, an adjoining narrower portion 20b disposed principally in the second recess portion 14b, and a part-circular-shaped portion 20c disposed symmetrically in the third recess portion 14c. The part-circular portion 20c provides a bifurcation of the strip 20 into two, symmetrically disposed segments, each extending part-way around the circumference of a circle.

As best shown in FIG. 3, there is a cavity region 22 of n+ type material formed integrally with the substrate 10 and located in contact with the part-circular portion 20c of the bias supply strip 20. Preferably, the cavity region 22 is approximately circular in plan view, to form a conventional cavity of the radial line type, and makes contact with the strip 20c about its periphery. It will be appreciated, however, that cavities of other shapes may be employed. Beneath the cavity 22 and at its center, as viewed in FIG. 3, lies the Gunn diode 18, comprising an upper layer 18a (again as viewed in FIG. 3) of n type material and a lower layer 18b of n+ type material. The lower layer 18b is in contact with the finger 16 of the heat sink layer 12.

As shown in the cross-sectional view of FIG. 3, the layered structure of the device also includes a thin layer of silicon dioxide ($SiO_2$) 24 and a layer of crystalline GaAs 26, together having a thickness about the same as the cavity region 22 and extending across the entire substrate area except for the cavity region. A three-layer sandwich comprising another layer 28 of crystalline GaAs and surrounding layers 30 and 32 of $SiO_2$, extends beneath the layer 26 and the cavity region 22, covering the entire substrate area except for the diode 18 itself and the part-circular portion 20c of the bias supply strip 20.

A baseplate 34 supports the entire structure and also performs a heat-sink function by contacting the heat-sink layer 12. Electrical connection to the bias supply strip 20 is made through a connector strip 36, which is mechanically supported on an insulated pedestal 38 on the baseplate 34.

In operation, the device is biased into its unstable, oscillatory region by a bias current supplied through the bias conductor strip 20. The bias current reaches the Gunn diode 18 through the cavity region 22, and the return current path is through the heat-sink layer 12. Microwave or millimeter-wave energy is coupled from the cavity region into the dielectric waveguide formed by the substrate 10, and is thence transmitted along the waveguide. The illustrative waveguide shown in FIG. 1 terminates at a tapered sharp point 40 for launching the energy into another waveguide (not shown) or for operation as a transmission antenna. A portion of the upper surface of the dielectric waveguide or substrate 10 may also be metalized, as shown at 42, to minimize unwanted radiation straight through the substrate.

The narrow portion 20b of the bias current conductive strip functions as a radio-frequency choke or low-pass filter, to prevent unwanted transmission of radio-frequency energy back along the conductive strip.

The application for Gunn effect diodes of this general type including local oscillators for radio-frequency mixers, amplifiers, power-combiners, and so forth. Although the invention has been described in relation to Gunn effect devices, it also has application to other active semiconductor devices, such as IMPATT diodes, which can also be fabricated in situ on a substrate serving as a dielectric waveguide.

The techniques employed in manufacturing devices in accordance with the present invention may be selected from a variety of conventional epitaxial fabrication processes, including molecular beam epitaxial deposition, photolithography, ion implantation, proton bombardment, diffusion, and chemical vapor deposition. The specific process and combination of process steps employed are not believed to be critical to the invention.

It will appreciated from the foregoing that the present invention represents a significant advance in the field of active semiconductor devices operating at extremely high frequencies. In particular, the invention provides an active device, such as a Gunn effect device, fabricated in situ on a substrate that also serves as a dielectric waveguide to propagate radio-frequency energy from the device. It will also be appreciated that, although the invention has been described in detail for purposes of illustration, various modifications may be made without departing from the spirit and scope of the invention. Accordingly, the invention is not to be limited except as by the appended claims.

We claim:

1. A monolithic semiconductor device capable of operation at extremely high frequencies, said device comprising:
   a substrate that serves as a waveguide as well as a substrate;
   a metallic layer on said substrate having a recess opening toward said substrate and defining a cavity and a contact portion extending across said recess;
   an active high-frequency semiconductor device within said cavity between and in contact with said substrate and said contact portion including a first semiconductor layer on said substrate extending across said cavity beyond said contact portion and a second semiconductor layer in contact with said contact portion; and
   conductor means on said substrate within said recess and contacting said first semiconductor layer for supplying power to said device.

2. A monolithic semiconductor device as set forth in claim 1, wherein said substrate is of a semi-insulating material having a resistivity of the order of $10^7$ ohm-centimeter.

3. A monolithic semiconductor device as set forth in claim 1, wherein said active semiconductor device is a Gunn effect device.

4. A monolithic semiconductor device as set forth in claim 1, wherein:
   said cavity is approximately circular; and
   said conductor means is a strip having an arcuate portion in contact with said first semiconductor layer near its periphery.

5. A monolithic semiconductor device as set forth in claim 1 or 4, wherein said conductive means includes a choke region to prevent transmission of radio-frequency energy along said conductive strip.

6. A monolithic Gunn effect device capable of operation at extremely high frequencies, said device comprising:
   a semi-insulating substrate that serves as a waveguide as well as a substrate;
   a Gunn effect device formed integrally on a surface of said substrate, said Gunn effect device having a plurality of semiconductive layers and an adjacent semiconductive cavity region;
   a metalized layer covering a large proportion of one face of said substrate and contacting said Gunn effect device to provide a heat sink and an electrical contact therewith; and
   a bias-current conductive strip formed adjacent said substrate and having a portion in contact with one of said semiconductive layers to provide electrical contact with said Gunn effect device;
   whereby radio-frequency energy is propagated out of said cavity region and into said substrate acting as a waveguide.

7. A monolithic Gunn effect device as set forth in claim 6, wherein said bias-current conductive strip includes a reduced width portion to provide a choke for inhibiting transmission of radio-frequency energy back along said strip.

8. A monolithic Gunn effect device as set forth in claim 7, wherein said portion of said bias-current conductive strip is bifurcated and arcuate in shape, to conform with a peripheral portion of said cavity region.

9. A monolithic Gunn effect device as set forth in claim 8, wherein said metalized layer is selectively omitted to define a recess in which said bias-current conductive strip is disposed.

10. A monolithic Gunn effect device as set forth in claim 9, wherein said metalized layer includes a finger projecting into said recess and contacting said Gunn effect device to conduct both heat and bias current therefrom.

11. A monolithic Gunn effect devices as set forth in claim 6, wherein said portion of said bias-current conductive strip is bifurcated and arcuate in shape, to conform with a peripheral portion of said cavity region.

12. A monolithic Gunn effect device as set forth in claim 7, wherein:
   said substrate is of semi-insulating gallium arsenide;
   said cavity region is of n+ type gallium arsenide; and
   said Gunn effect device includes a layer of n type gallium arsenide in contact with said cavity region, and a layer of n+ type gallium arsenide between said n type layer and said metalized layer.

13. A monolithic Gunn effect device as set forth in claim 6, and further including a second metalized layer covering at least a portion of the surface of said substrate opposite the one on which said Gunn effect device is formed, to inhibit radiation of radio-frequency energy out of said substrate.

14. A monolithic Gunn effect device as set forth in claim 13, wherein said substrate is elongated and terminates in a tapered end to provide launching of radio-frequency energy generated by said Gunn effect device.

* * * * *